United States Patent [19]
Peterson

[11] Patent Number: 5,933,621
[45] Date of Patent: Aug. 3, 1999

[54] METHOD AND APPARATUS FOR TERMINAL EMULATION IN A SEMICONDUCTOR FABRICATING FACILITY

[75] Inventor: Roger G. Peterson, Rio Rancho, N.Mex.

[73] Assignee: LAM Research Corporation, Fremont, Calif.

[21] Appl. No.: 08/824,245

[22] Filed: Mar. 25, 1997

[51] Int. Cl.⁶ .................................................. G06F 9/455
[52] U.S. Cl. ........................................................... 395/500
[58] Field of Search ..................................... 395/500, 308

[56] References Cited

U.S. PATENT DOCUMENTS

| | | | |
|---|---|---|---|
| 4,663,009 | 5/1987 | Bloomquist et al. | 204/192.2 |
| 5,110,249 | 5/1992 | Norman | 414/217 |
| 5,261,079 | 11/1993 | Celi, Jr. | 395/500 |

*Primary Examiner*—Kevin J. Teska
*Assistant Examiner*—Ayni Mohamed

[57] ABSTRACT

A method and apparatus for emulating a dedicated terminal in semiconductor fabricator having a back end that includes a source of semiconductor substrates, a transport mechanism for transporting the substrates and a process chamber. A wall separates the back end from a front end environment. A central processing unit is provided that includes a driver for recognizing terminal text and display commands and that executes terminal text and display commands on the display screen of a terminal. A connector is provided at the back end and it is interconnected with the driver of the central processing unit. A microcomputer, that can be a laptop, personal computer or other relatively compact and portable computer is provided. This computer has a display screen and a commands entry device, such as a trackball or mouse, for manipulating commands on the display screen. The microcomputer recognizes commands input from the driver of the central processing unit and translates the commands into a printed form on the display screen. The microcomputer also translates commands in printed form on the display screen to a format recognized by the driver and it transmits the commands in this format to the driver.

16 Claims, 5 Drawing Sheets

METHOD AND APPARATUS FOR TERMINAL EMULATION IN A SEMICONDUCTOR FABRICATING FACILITY

FIELD OF THE INVENTION

This invention relates to a method and apparatus for emulating a terminal used in a semiconductor fabricating facility having a dividing wall and a terminal connector located on at least one side of the dividing wall.

BACKGROUND OF THE INVENTION

Figure 1:
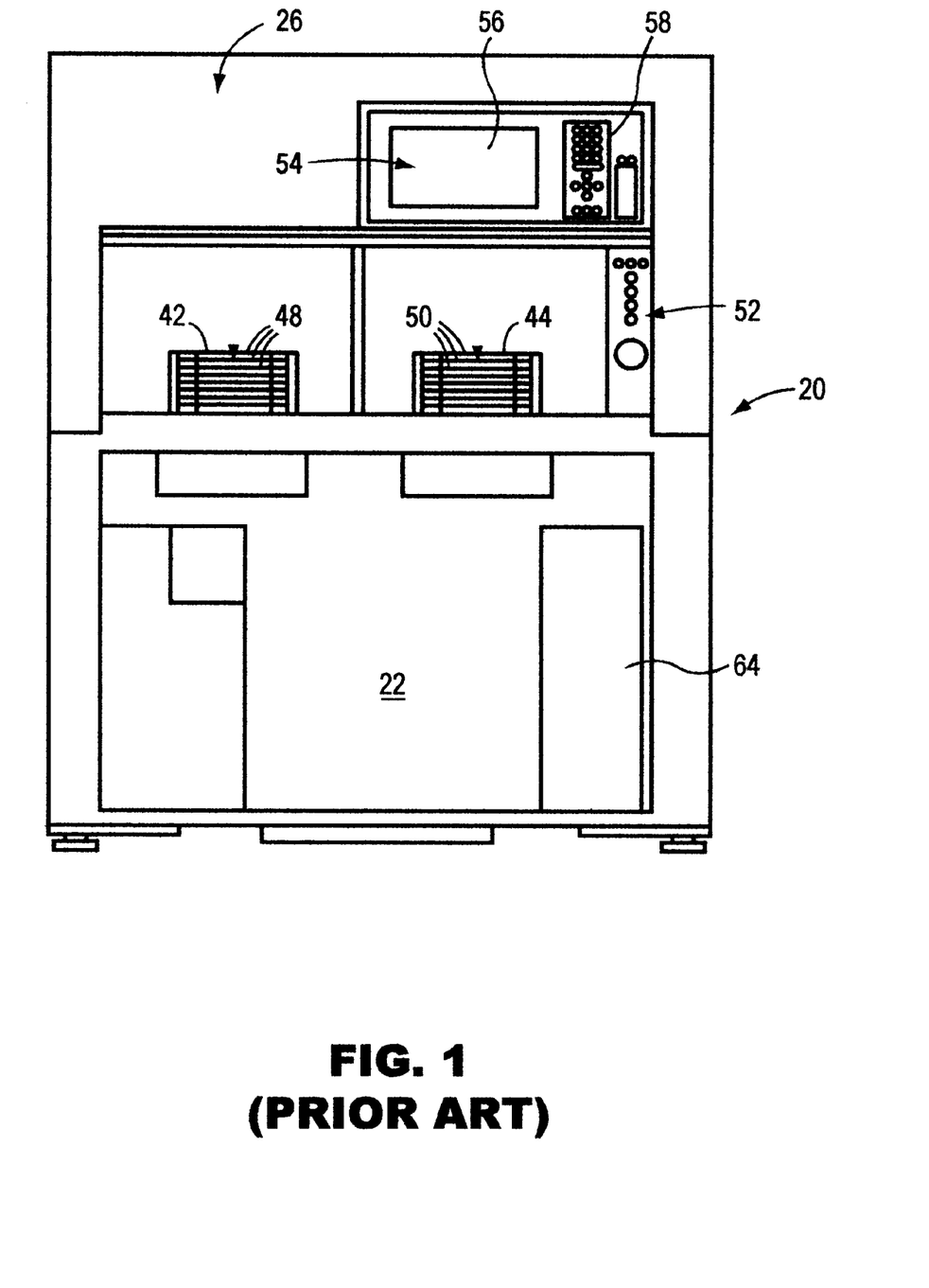
FIG. 1 is a front view of a semiconductor fabricator according to the prior art.
Figure 2:
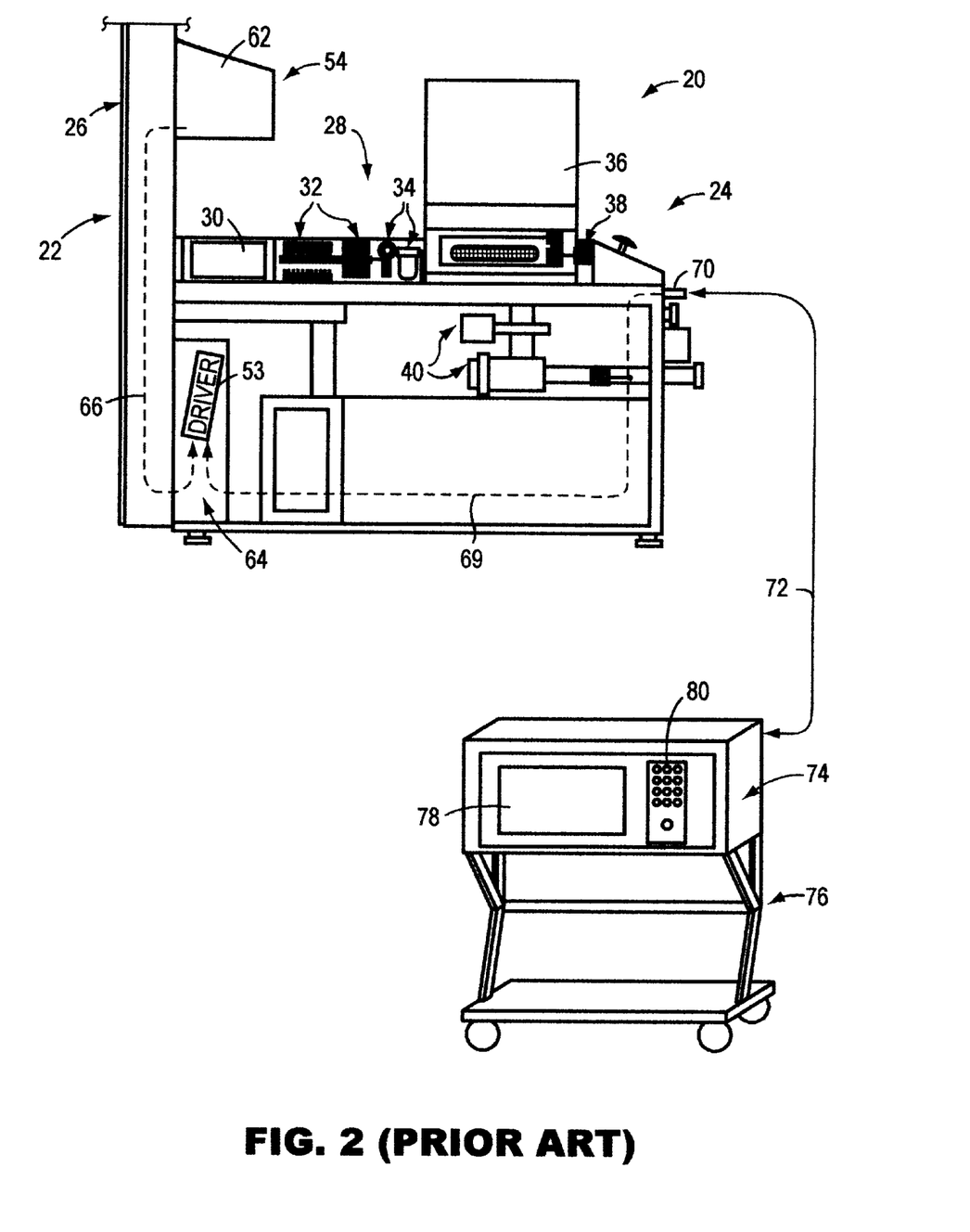
FIG. 2 is a side view of the fabricator of FIG. 1 including a portable back end terminal according to the prior art.

FIGS. 1 and 2 detail a semiconductor fabrication facility according to the prior art. The fabricator 20 forms circuit patterns on semiconductor wafer substrates according to preprogrammed instructions.

The fabricator 20 in this example is a Rainbow™ model 4400/4500 available from Lam Research of Fremont, Calif. The fabricator is constructed to include a "front end" 22 and a "back end" 24. The front end 22 (FIG. 1) is defined by an upstanding wall 26 that can include various transparent windows formed of glass, plexiglass or another transparent material. The front end 22 typically fronts on a clean room having a predefined level of environmental control. Similarly, the back end 24 is located in a clean room often having a different level of environmental control. The semiconductor fabrication mechanism 28 (FIG. 2) resides in the back end 24. Within the back end is contained an loadlock mechanism 30 for holding and transferring semiconductor wafers in a clean environment. A pneumatic tray assembly 32 transfers wafers into and out of the loadlock 30. A pneumatic regulator assembly 34 controls the action of the tray assembly 32.

Semiconductor wafers are processed by etching, deposition and other techniques in the process chamber 36. A manometer 38 regulates pressure within the process chamber 36, which is typically kept at a near-vacuum. A valve assembly 40 controls the atmosphere within the chamber 36. Operators interact with the fabricator 20 through the front end (FIG. 1). Semiconductor wafers are loaded for process into a send indexer 42. Likewise, processed semiconductor wafers are removed through a receive indexer 44. The individual semiconductor wafers 48 and 50 are held in the indexers 42 and 44, respectively in stacks. Power switching and other basic fabricator functions are operated via the front control panel 52. Data related to process parameters and other specific process functions is input and displayed through the operator interface control panel 54 which includes a display screen 56 and data entry buttons 58. Data, in the form of text and graphics is manipulated on the screen 56 using the buttons 58. A conventional cursor is provided on the screen.

The operator interface control panel 54 utilizes a well-known XYCOM® format industrial dedicated terminal available from XYCOM, Inc. Saline, Mich. The XYCOM® terminal acts as a so-called "dumb" in that it contains in its chassis 62 (FIG. 2) only minimal data processing and recognition capabilities and, rather, directly transmits and receives character and graphic data from the fabricator's central processing unit 64 through a data line 66 (shown in phantom). A terminal communications driver 53 of conventional design that is compatible with the XYCOM® data format. The control panel 54 is accessible only from the front end of the fabricator. Since the wall 26 separates the front end 22 from the back end 24, an operator on the back end cannot readily access the control panel 54. Accordingly, an optional data connection 70 is provided on the fabricator within the back end space. It is tied to the central processing unit 64 by a cable 69. The connector can comprise any acceptable style of connector, such as an RS232 standard connector. This connector enables interconnection of a data line 72 with another optional control panel 74 that is somewhat portable. This control panel 74 is kind of itself, a XYCOM® terminal mounted on a wheeled stand 76. The central processing unit 64 is design to recognize inputs from either the connector 70 or the front end control panel 54 and to respond to such inputs with operations and display data. Like the control panel 54, the portable control panel 74 includes a data screen 78 and data input buttons 80 and acts as a so-called dumb terminal, relying upon the data processing capabilities of the central processing unit 64 and driver 53 for display and interpretation of input data.

Since the front end 22 and back end 24 are separated by the wall 26, and typically, entire row of fabricators are provided side-by-side, it is not easy for an operator to move from the front end to the back end. This often necessitates the use of several portable control panels 74 within the back end space. These control panels are bulky and difficult to move about. They take up highly valuable floor space on the fabrication clean room floor. They are also expensive, owing to their size, uniqueness and specialized hardware such as a cart. Parts are not readily available for such specialized terminals and will become less available as terminals become obsolete. These control panels block the path of operators moving between fabricators and, in general, reduce productivity.

It is, therefore, an object of this invention to provide a substitute data-entry and display device for accessing the central processing unit of a semiconductor fabricator. This device should be readily available, highly portable and should occupy minimal floor space. The device can also be readily adaptable to augment or replace the front end control panel of a semiconductor fabricator.

SUMMARY OF THE INVENTION

A method and apparatus for emulating a dedicated terminal used in a semiconductor fabricating facility, according to this invention, provides a microcomputer such as a compact personal computer or laptop computer that translates data commands from a format recognized by the back end operator control panel into a format useable by a personal computer to effect input of data to, and display of data from, the fabricator's central processing unit.

According to a preferred embodiment the invention provides a semiconductor fabricator having a back end that includes a source of semiconductor substrates, a transport mechanism for transporting the substrates and a process chamber. A wall separates the back end from a front end environment. A central processing unit is provided that includes a driver for recognizing terminal text and display commands and that executes terminal text and display commands on the display screen of a terminal. The terminal can be a XYCOM® terminal. A connector is provided at the back end and it is interconnected with the driver of the central processing unit. A microcomputer, that can be a laptop, personal computer or other relatively compact and portable computer is provided. This computer has a display screen and a data entry device, such as a trackball or mouse, for manipulating data on the display screen. The microcomputer recognizes commands input from the driver of the central processing unit and translates the commands into a printed form on the display screen. The microcomputer also translates commands in printed form on the display screen to a format recognized by the driver and it transmits the commands in this format to the driver.

Commands are identified based upon predetermined identifiers placed within the data string transmitted to and from the Central Processing Unit. Data strings having text are extracted from each command translated the translation can include a mapping between commands provided in a format recognized by the microcomputer and commands provided in a format recognized by the terminal. Command functions are executed by printing on the display screen when received from the Central Processing Unit and are transmitted in a terminal format from the display screen when input by an operator to the microcomputer. The display screen can include a graphical user interface and a mouse or trackball to manipulate a cursor around the display screen to execute commands and the Central Processing Unit can provide various screens and menus for the graphical user interface.

BRIEF DESCRIPTION OF THE DRAWINGS

The foregoing and other objects and advantages of the invention will become more clear with reference to the following detailed description as illustrated by the drawings in which.

DETAILED DESCRIPTION OF AN ILLUSTRATIVE EMBODIMENT

Figure 3:
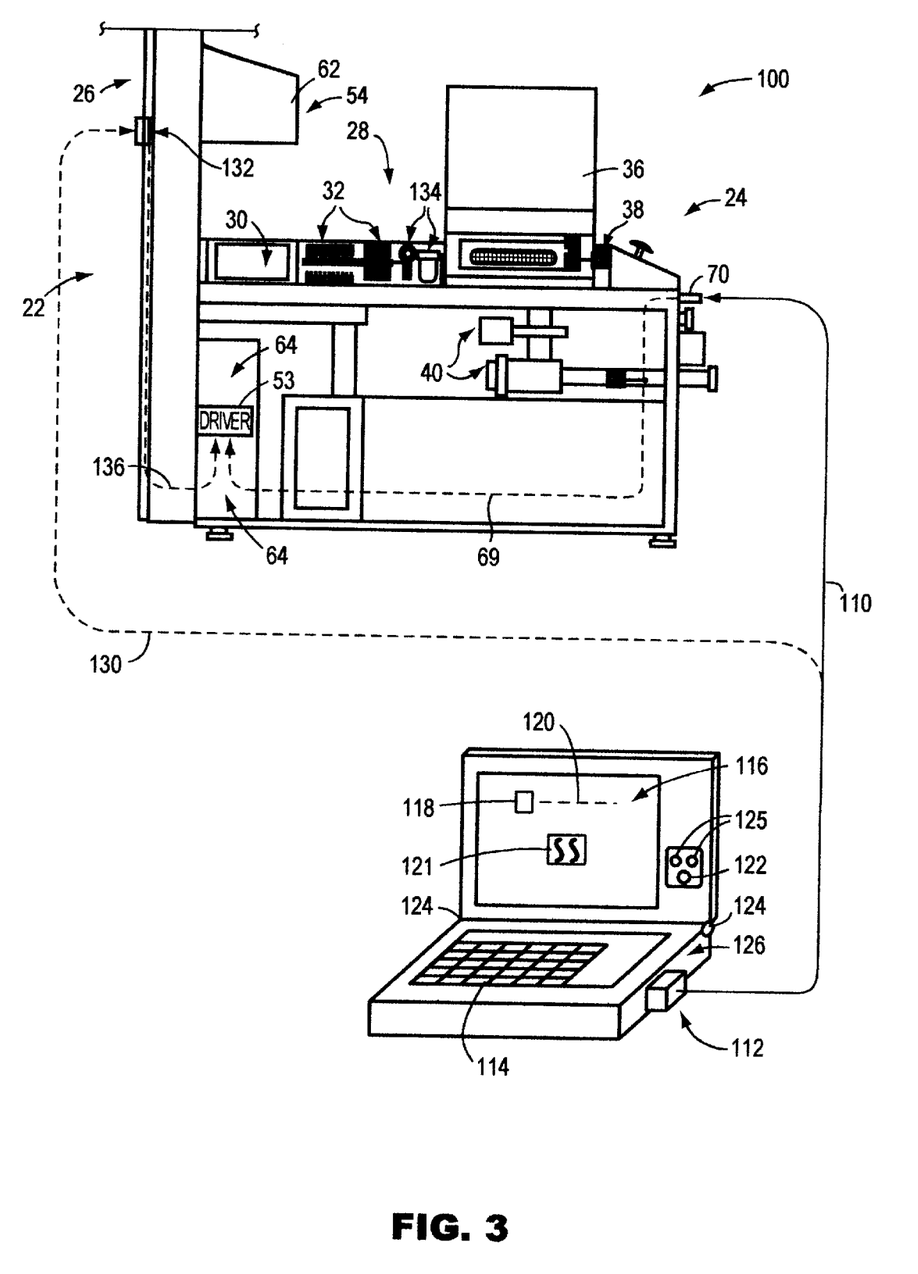
FIG. 3 is a side view of a semiconductor fabricator including a personal computer terminal emulator interconnected with the back end according to this invention.

FIG. 3 shows a fabricator 100 according to this invention. The fabricator 100 includes components that are identical to those in the fabricator 20 according to the prior art. Such components are given like reference numbers and the reader can refer to the discussion above for a description of these components.

In this embodiment, the back end connector 70 is linked by a data line 110 with a compact microcomputer 112 having an on-board microprocessor (such as the Intel Pentium® processor not shown), a keyboard 114, a display screen for displaying a cursor 118, text 120 and graphical data 121. A track-ball 122 or similar mouse assembly can also be provided for moving the cursor 118 about the display screen 116. The trackball 122 includes buttons 125 for executing data entry operations when the cursor is located at or on predetermined icons. The microcomputer 112 is a type commonly known as a laptop in which the display screen 116 is hinged by hinges 124 to the main chassis 126. The term "microcomputer" shall be wed interchangeably with "personal computer" herein. These works should be taken to describe any portable or semi-portable computer with a microprocessor for on-board data processing. The computer can be powered by an AC source (not shown) or by on-board batteries (neither shown). Such an arrangement is highly portable and occupies a minimum amount of floor space. Similarly, it is contemplated that larger stand-alone personal computers with a separate monitor, keyboard and chassis can be provided. The term microcomputer should be taken broadly to include such units.

The communication line 110 can be a parallel line or a serial line. It is interconnected to an appropriate port on the microcomputer 112 in a manner known to those of ordinary skill. It is assumed that appropriate communications software of known design is provided to the microcomputer for effecting transfer of data over the line 110.

Another data line 130 can be interconnected with a connector 132 located on the front end 22 of the fabricator 100. The connector 132 can also be a serial or parallel port connector and is interconnected with the Central Processing Unit 64 by a data line 136.

The connector 132 enables the microcomputer 112 to be attached to the front end of the fabricator 100, augmenting or replacing the control panel 54.

As noted above, the connector 70 and 132 can be serial or parallel connectors. According to one embodiment, an RS232 standard connector is utilized.

The central processing unit 64 of this embodiment includes a wellknown Motorola 6800 Series™ microprocessor. Appropriate memory as well as a hard disk and other data storage devices can be provided. The central processing unit 64 controls the operation of the mechanism 28 and the specific processed steps performed by the processing chamber 36. As noted above, such processors can include plasma etching and vapor deposition among other well known semiconductor fabrication processors.

The central processing unit 64 also includes wellknown hardware and software for transmitting and receiving data from a terminal. A driver 53 implemented in hardware, software or both is provided as a terminal interface. In particular, the XYCOM® terminal described above provides the format for text and command transmission between the control panel and the Central Processing Unit. The printing of text, color of text and background, movement of the cursor and presence of the cursor on the display screen are controlled by a series of specific commands that are recognized by the XYCOM® terminal when received from the central processing unit. Likewise, XYCOM® terminal transmits commands and data according to the same format back to the central processing unit.

Figure 4:
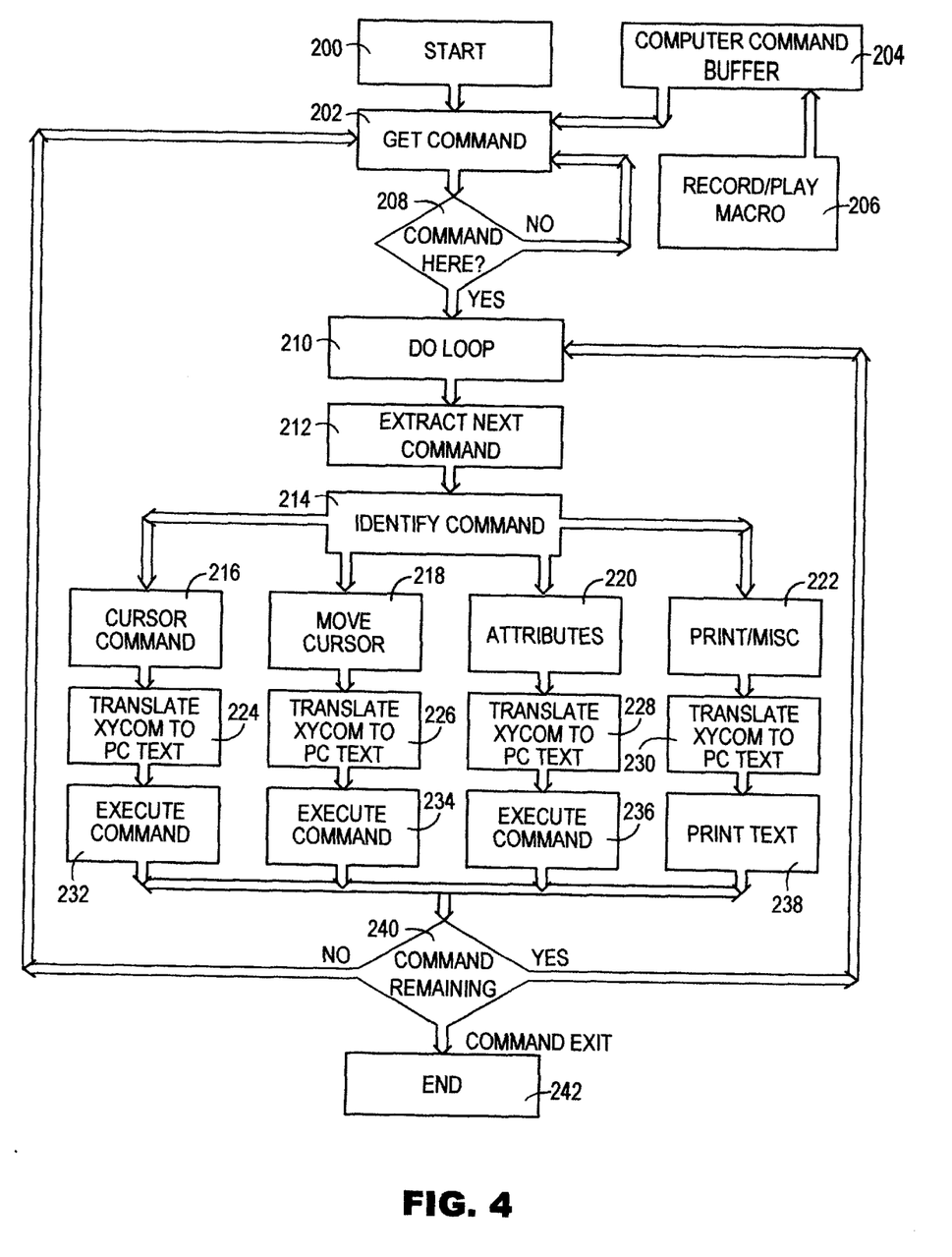
FIG. 4 is a block diagram of a procedure for translating commands from a format recognized by a terminal and a format recognized by the personal computer of FIG. 3.

FIG. 4 shows a block diagram of a translation procedure that enables the microcomputer 112 to act in place of the XYCOM® terminal in display information. At initiation, a start command 200 is recognized by the microcomputer procedure. This initiates a loop 202 in which the microcomputer queries for commands. The commands can be input from the computer command buffer 204 which stores current commands. Alternatively, a macro storage device 206 such as a disk or peripheral memory can be the source or sink of commands. As will be described further below, each command in the XYCOM® format is identified by "<esc>[". Each time this identifier presents itself, the decision block 208 routes the procedure into a loop 210. The text characters following the command identifier are extracted and the text is then identified to determine the type of command (see Table I). There are four basic types of commands according to this embodiment. The first type of command is a cursor command 216 that indicates whether to show or hide the cursor from the screen. The second type of command is a move cursor command 218 that comprises an x and y component representative of the location on the screen to which the cursor is moved.

The attributes command 220 defines the text and background colors, point size of the text and foreground color. Finally, the print and miscellaneous command 222 defines the nature of print (e.g. the specific characters and graphics) to be printed at the current location of the cursor. The identified command block 214 utilizes a look-up table that includes each of the command types to route the decision tree to the appropriate location.

Each command undergoes a translation from its original XYCOM® text to compatible microcomputer text. Respective translation blocks 224, 226, 228 and 230 are shown. The translation consists of a look-up table (see Table II) that transforms the ASCII character from XYCOM® format into the ASCII character for microcomputer format and vice versa. Many ASCII characters are compatible between XYCOM° and microcomputer formats. If no translation is shown in the table, then the original character is used. Finally, the command is executed by each respective execute command block 232, 234 and 236 and the print text block 238.

After each command is executed, the loop queries whether further commands remain in the decision block 240. If further commands remain within the extracted group (212) then the loop returns to the starting point 210. If no remaining commands are in the extracted group then the decision block 240 branches back to the get command block 202 to look for further commands. The get command block 202 continues to access commands until the identifier "<esc>[" is no longer identified. If the final command indicates exit then the translation procedure will end at block 242.

Figure 5:
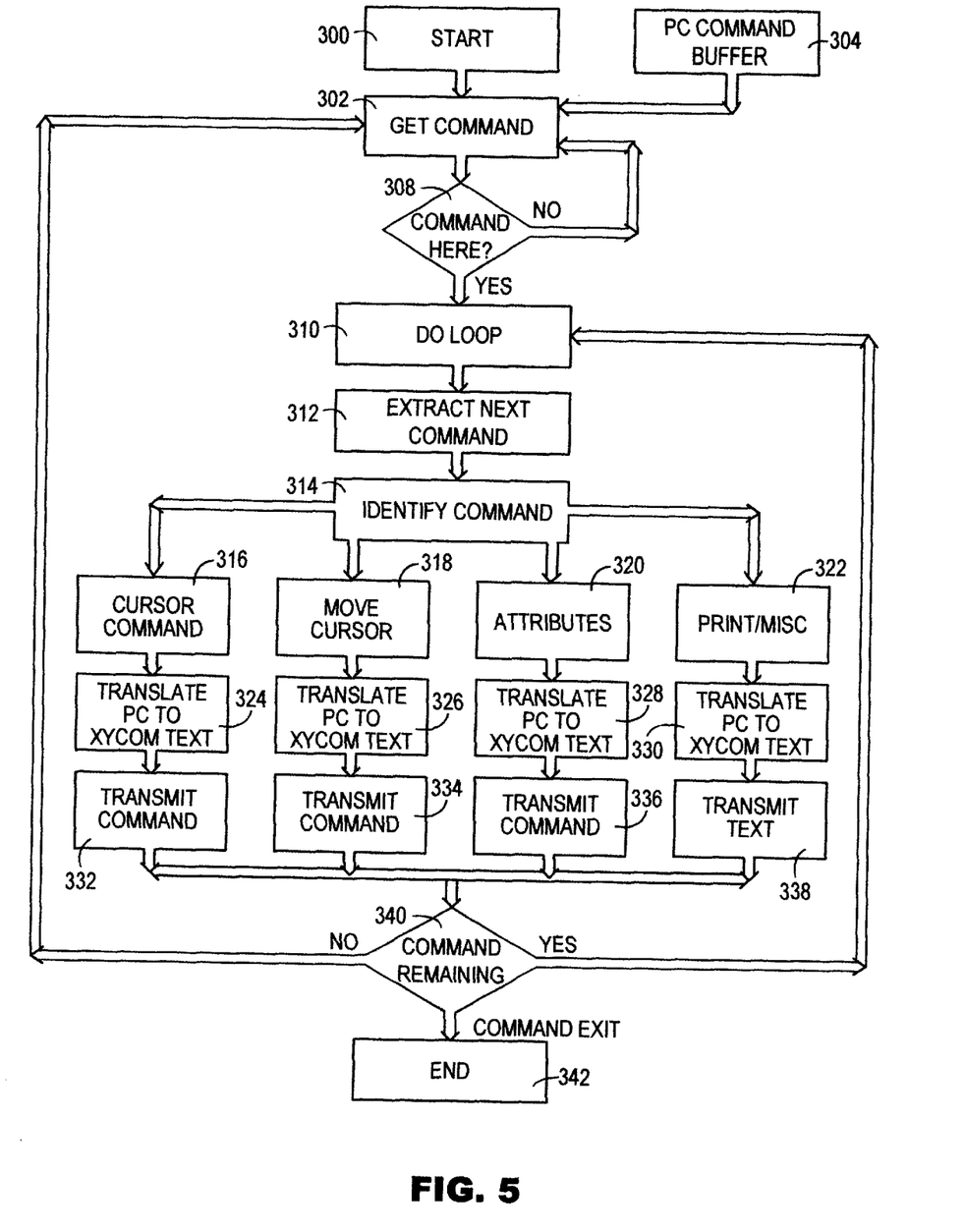
Fig. 5 is a block diagram of a procedure for translating commands from a format recognized by a personal computer to a format recognized by a terminal.

The foregoing description of FIG. 4 relates specifically to the receipt of commands from the central processing unit 64 to the microcomputer for display by the microcomputer. Conversely, FIG. 5 illustrates the reverse procedure in which commands are store in the PC command buffer 304. These commands are derived from screen data that has been manipulated by the keyboard and/or cursor-moving trackball 122. Commands are received by the command buffer block 302 following initiation of the procedure 300. A macro file 305 can be stored in the microcomputer for playback to the buffer 304. The decision block 308 queries for commands and, when commands are identified enters the loop 310. The PC formatted command text is extracted in block 312 and the command is identified in block 314. Cursor commands 316 movement commands 318 attribute commands 320 and print commands 322 are recognized. Each command each translated in a respective translation block 324, 326, 328 and 330 from the PC format into XYCOM® text. This occurs according to the above described look-up table (see Table II). Commands are then transmitted in blocks 332, 334 and 336 or text is transmitted in block 338. The central processing unit 64 receives the appropriate string of commands through the drivers 53, and interprets the swing in order to perform processing functions based upon the recognized commands. Commands continue to be transmitted until no remaining commands are queried by the decision block 308. When the procedure is completed, an exit signal instructs the procedure to end in block 342.

The following tables are used in conjunction with the translation procedures shown in FIGS. 4 and 5 of this embodiment. Table I shows the identifiers for different recognized commands. Table II shows the translation between XYCOM® ASCII characters and microcomputer/PC ASCII characters.

TABLE I

| Command | Definition |
| --- | --- |
| <esc> = | Normal Keypad Mode |
| <esc> > | Remote Keypad Mode |
| <esc> [1h | Show Cursor |
| <esc> [1l | Hide Cursor |
| <esc> [1;attr1;attr2p | Attribute Command and Misc. Graphics |
| <esc> [x;yH | Move Cursor to x,y |
| <esc> [K | Clear Line |
| <esc> [J | Clear Line |

*Remaining Commands not used

TABLE II

| XYCOM ASCII Character | PC ASCII Character |
| --- | --- |
| 135 | 195 |
| 141 | 180 |
| 142 | 194 |
| 143 | 194 |
| 139 | 193 |
| 133 | 179 |
| 131 | 192 |
| 130 | 180 |
| 128 | 250 |
| 129 | 197 |
| 138 | 196 |
| 205 | 24 |
| 202 | 16 |
| 204 | 25 |
| 255 | 219 |
| 206 | 48 |
| 207 | 219 |

*All other ASCII Characters are compatible.

The foregoing has been a detailed description of a preferred embodiment. Various modifications and additions can be made without departing from the spirit and scope of this invention. For example, while a XYCOM® terminal is emulated according to this invention, it is contemplated that other types of terminal used in conjunction with semiconductor fabrication devices can be emulated. While wired connections are shown between each of the front end and back end and the respective microcomputer, wireless connections are also contemplated using, for example, two-way radios and infrared repeaters. It is further contemplated that any acceptable screen configuration can be used such as a graphical user interface or a basic line-by-line printout of text. It is further contemplated that any acceptable operating system can be used for the microcomputer/PC of this invention. Furthermore, translation tables can be adapted to the particular formats found in both the microcomputer/PC and the terminal to be emulated.

Accordingly, this description is meant to be taken only by way example and not to otherwise limit the scope of the invention.

What is claimed is:

1. In a semiconductor fabricator having a back end that includes a source of semiconductor substrates, a transport mechanism for transporting the substrates and a process chamber, a wall for separating the back end from a front end environment, a central processing unit including a driver for recognizing terminal text and display commands and for executing terminal text and display commands on a display screen of a terminal, and a connector at the back end interconnected with the driver, and an emulator of the terminal comprising:

a microcomputer having a display screen and a data entry device for manipulating data on the display screen, the microcomputer including means for recognizing commands input from the driver and means for translating the commands to a printed form on the display screen;

means for translating commands in a printed form on the display screen to a format recognized by the driver and means for transmitting the commands to the driver and wherein the means for recognizing commands further includes a means for reading command identifiers comprising a predetermined group of characters.

2. The emulator as set forth in claim 1 wherein the microcomputer comprises a laptop computer.

3. The emulator as set forth in claim 1 wherein the means for translating commands in a printed form on the display screen to a form recognized by the driver includes means for mapping commands from a format recognized by the terminal to a format recognized by the microcomputer.

4. The emulator as set forth in claim 1 wherein the data entry device includes at least one of a trackball and a mouse for moving a cursor about the display screen.

5. In a semiconductor fabricator having a back end that includes a source of semiconductor substrates, a transport mechanism for transporting the substrates and a process chamber, a wall for separating the back end from a front end environment, a central processing unit including a driver for recognizing terminal text and display commands and for executing terminal text and display commands on a display screen of a terminal, and a connector at the back end interconnected with the driver, and an emulator of the terminal comprising:

a microcomputer having a display screen and a data entry device for manipulating data on the display screen, the microcomputer including means for recognizing commands input from the driver and means for translating the commands to a printed form on the display screen;

means for translating commands in a printed form on the display screen to a format recognized by the driver and means for transmitting the commands to the driver; and wherein the means for translating commands in a printed form on the display screen to a form recognized by the driver includes means for identifying identifiers used by the microcomputer representative of display screen commands and text.

6. The emulator as set forth in claim 5 wherein the means for translating commands in a printed form on the display screen to a format recognized by the driver further includes means for mapping text and commands from a format recognized by the terminal to a format recognized by the microcomputer.

7. In a semiconductor fabricator having a back end that includes a source of semiconductor substrates, a transport mechanism for transporting the substrates and a process chamber, a wall for separating the back end from a front end environment, a central processing unit including a driver for recognizing terminal text and display commands and for executing terminal text and display commands on a display screen of a terminal, and a connector at the back end interconnected with the driver, and an emulator of the terminal comprising:

a microcomputer having a display screen and a data entry device for manipulating data on the display screen, the microcomputer including means for recognizing commands input from the driver and means for translating the commands to a printed form on the display screen;

means for translating commands in a printed form on the display screen to a format recognized by the driver and means for transmitting the commands to the driver; and wherein each of the means for translating commands to a printed form and the means for translating commands in a printed form on the display screen to a form recognized by the driver further includes means for mapping text and commands from a format recognized by the terminal to a format recognized by the microcomputer.

8. A method for emulating a terminal interconnected at a back end of a semiconductor fabricator, the fabricator having a back end that includes a source of semiconductor substrates, a transport mechanism for transporting the substrates and a process chamber, a wall for separating the back end from a front end environment, a Central Processing Unit including a driver for recognizing terminal text and display commands and for executing terminal text and display commands on a display screen of the terminal-to-be-emulated, and a connector at the back end interconnected with the driver, the method comprising:

interconnecting a microcomputer having a display screen and a commands entry device for manipulating commands on the display screen;

recognizing commands input from the driver and translating the commands to a printed form on the display screen;

translating commands in a printed form on the display screen to a format recognized by the driver and transmitting the commands to the driver; and wherein the step of recognizing commands further includes reading command identifiers comprising a predetermined group of characters.

9. The method as set forth in claim 8 wherein the step of translating commands in a printed form on the display screen to a form recognized by the driver includes mapping commands from a format recognized by the terminal to a format recognized by the microcomputer.

10. The method as set forth in claim 8 wherein the step of translating commands in a printed form on the display screen to a form recognized by the driver includes identifying identifiers used by the microcomputer representative of display screen commands and text.

11. The method as set forth in claim 10 wherein the step of translating commands in a printed form on the display screen to a format recognized by the driver further includes mapping text and commands from a format recognized by the terminal to a format recognized by the microcomputer.

12. The method as set forth in claim 8 wherein each of the step of translating commands to a printed form and the step of translating commands in a printed form on the display screen to a form recognized by the driver further includes mapping text and commands from a format recognized by the terminal to a format recognized by the microcomputer.

13. The method as set forth in claim 8 further comprising inputting commands using a commands entry including moving at least one of a trackball and a mouse to manipulate a cursor about the display screen.

14. A method for emulating a terminal interconnected at a back end of a semiconductor fabricator, the fabricator having a back end that includes a source of semiconductor substrates, a transport mechanism for transporting the substrates and a process chamber, a wall for separating the back end from a front end environment, a Central Processing Unit including a driver for recognizing terminal text and display commands and for executing terminal text and display commands on a display screen of the terminal-to-be-emulated, and a connector at the back end interconnected with the driver, the method comprising:

interconnecting a microcomputer having a display screen and a commands entry device for manipulating commands on the display screen;

recognizing commands input from the driver and translating the commands to a printed form on the display;

translating commands in a printed form on the display screen to a format recognized by the driver and transmitting the commands to the driver; and wherein the step of translating commands in a printed form on the display screen to a form recognized by the driver includes identifying identifiers used by the microcomputer representative of display screen commands and text.

15. The method as set forth in claim 14 wherein each of the step of translating commands to a printed form and the step of translating commands in a printed form on the display screen to a form recognized by the driver further includes mapping text and commands from a format recognized by the terminal to a format recognized by the microcomputer.

16. The method as set forth in claim 15 further comprising inputting commands using a commands entry including moving at least one of a trackball and a mouse to manipulate a cursor about the display screen.

\* \* \* \* \*